US010938354B2

(12) United States Patent
Lin et al.

(10) Patent No.: US 10,938,354 B2
(45) Date of Patent: Mar. 2, 2021

(54) AMPLIFICATION DEVICE

(71) Applicant: RichWave Technology Corp., Taipei (TW)

(72) Inventors: Jhao-Yi Lin, Taipei (TW); Chih-Sheng Chen, Taipei (TW); Ching-Wen Hsu, Taipei (TW)

(73) Assignee: RichWave Technology Corp., Taipei (TW)

( * ) Notice: Subject to any disclaimer, the term of this patent is extended or adjusted under 35 U.S.C. 154(b) by 7 days.

(21) Appl. No.: 16/386,293

(22) Filed: Apr. 17, 2019

(65) Prior Publication Data

US 2020/0162031 A1    May 21, 2020

(30) Foreign Application Priority Data

Nov. 20, 2018 (TW) ................................ 107141234

(51) Int. Cl.
*H03F 3/04* (2006.01)
*H03F 1/32* (2006.01)
(Continued)

(52) U.S. Cl.
CPC ................. *H03F 1/32* (2013.01); *H03F 1/52* (2013.01); *H03F 3/19* (2013.01); *H03F 1/302* (2013.01);
(Continued)

(58) Field of Classification Search
CPC ..... H03F 1/32; H03F 1/52; H03F 3/19; H03F 2200/444; H03F 2200/426; H03F 2200/441; H03F 2200/451; H03F 3/217; H03F 3/602; H03F 3/607; H03F 3/60; H03F 1/0261; H03F 1/523; H03F 2200/78; H03G 3/3042; H03G 1/0052; H03G 1/007; H03G 3/3015; H03G 3/3047
(Continued)

(56) References Cited

U.S. PATENT DOCUMENTS 5,526,214 A * 6/1996 Takata ............... H03K 17/0826
361/56
6,271,727 B1 * 8/2001 Schmukler ........... H03G 1/0058
330/284
(Continued)

FOREIGN PATENT DOCUMENTS

TW    201735531 A    10/2017
TW    201834387 A    9/2018

*Primary Examiner* — Khanh V Nguyen
(74) *Attorney, Agent, or Firm* — Winston Hsu (57) ABSTRACT

An amplification device includes an amplification circuit and a protection circuit. The amplification circuit includes a transistor having a first terminal for outputting an amplified radio frequency signal, a second terminal, and a control terminal coupled to the input terminal of the amplification circuit for receiving a radio frequency signal to be amplified. The protection circuit has a first terminal coupled to the output terminal or the input terminal of the amplification circuit, and a second terminal. The protection circuit includes a switch and a first voltage clamping unit. The switch unit is turned on or turned off according to a control signal. The first voltage clamping unit is coupled to the switch unit for clamping a voltage at the first terminal of the protection circuit within a predetermined region when the switch unit is turned on.

17 Claims, 4 Drawing Sheets

(51) Int. Cl.
*H03F 1/52* (2006.01)
*H03F 3/19* (2006.01)
*H03F 1/30* (2006.01)

(52) U.S. Cl.
CPC .... *H03F 2200/18* (2013.01); *H03F 2200/426* (2013.01); *H03F 2200/441* (2013.01); *H03F 2200/444* (2013.01); *H03F 2200/451* (2013.01)

(58) Field of Classification Search
USPC .................. 330/207 P, 283, 285, 296, 298
See application file for complete search history.

(56) References Cited

U.S. PATENT DOCUMENTS

| | | | |
|---|---|---|---|
| 6,768,377 B2 | 7/2004 | Macedo | |
| 8,094,423 B2 * | 1/2012 | Bouchet | H03F 1/523 361/91.1 |
| 8,680,923 B2 * | 3/2014 | Matsuda | H03F 1/0272 330/253 |
| 8,994,454 B2 * | 3/2015 | Murakami | H03F 1/02 330/207 P |

\* cited by examiner

AMPLIFICATION DEVICE

CROSS REFERENCE TO RELATED APPLICATION

This application claims priority of Taiwan application No. 107141234, which was filed on Nov. 20, 2018, and is included herein by reference.

TECHNICAL FIELD

The present invention is related to an amplification device, and more particularly, to an amplification device capable of maintaining linearity in the bypass mode.

BACKGROUND

In the communication module of the mobile electronic device, the transmission and reception of RF signals are usually performed with the same antenna. For example, the transmitter and the receiver in the communication module can be coupled to the same antenna. When the communication module needs to receive the RF signal through the antenna, the communication module would activate the low noise amplifier (LNA) in the receiver to amplify the RF signals to obtain the information. Also, when the communication module needs to transmit the RF signals through the antenna, the communication module would activate the power amplifier (PA) in the transmitter to amplify the RF signals and output the RF signals through the antenna.

Generally, the low noise amplifier at the receiver may be rather vulnerable to withstand high power signals. Therefore, when the communication module receives the RF signals through the antenna, if the system activates the transmitter or couples the energy of the transmitter internally, the RF signals generated by the transmitter will be inputted to the low noise amplifier, causing the low noise amplifier to not function properly and even damage the low noise amplifier.

In prior art, in order to protect the low noise amplifier, a clamp circuit is usually added at the input terminal of the low noise amplifier to prevent the over swinging RF signal generated by the transmitter from entering the low noise amplifier and causing damage. However, the matching impedance inside the receiver is also changed, making the receiver fail to achieve the expected performance in the linearity of signal amplification.

SUMMARY

One embodiment of the present invention discloses an amplification device. The amplification device includes an amplification circuit and a protection circuit.

The amplification circuit amplifies an input signal. The amplification circuit has an input terminal for receiving the input signal, and an output terminal for outputting an amplified input signal. The amplification circuit includes a transistor having a first terminal for outputting the amplified input signal, a second terminal, and a control terminal coupled to the input terminal of the amplification circuit.

The protection circuit has a first terminal coupled to the output terminal of the amplification circuit or the input terminal of the amplification circuit, and a second terminal. The protection circuit includes a switch unit and a voltage clamping unit. The switch unit can be turned on or turned off according to a control signal. The voltage clamping unit is coupled to the switch unit, and clamps a voltage at the first terminal of the protection circuit within a predetermined region when the switch unit is turned on.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
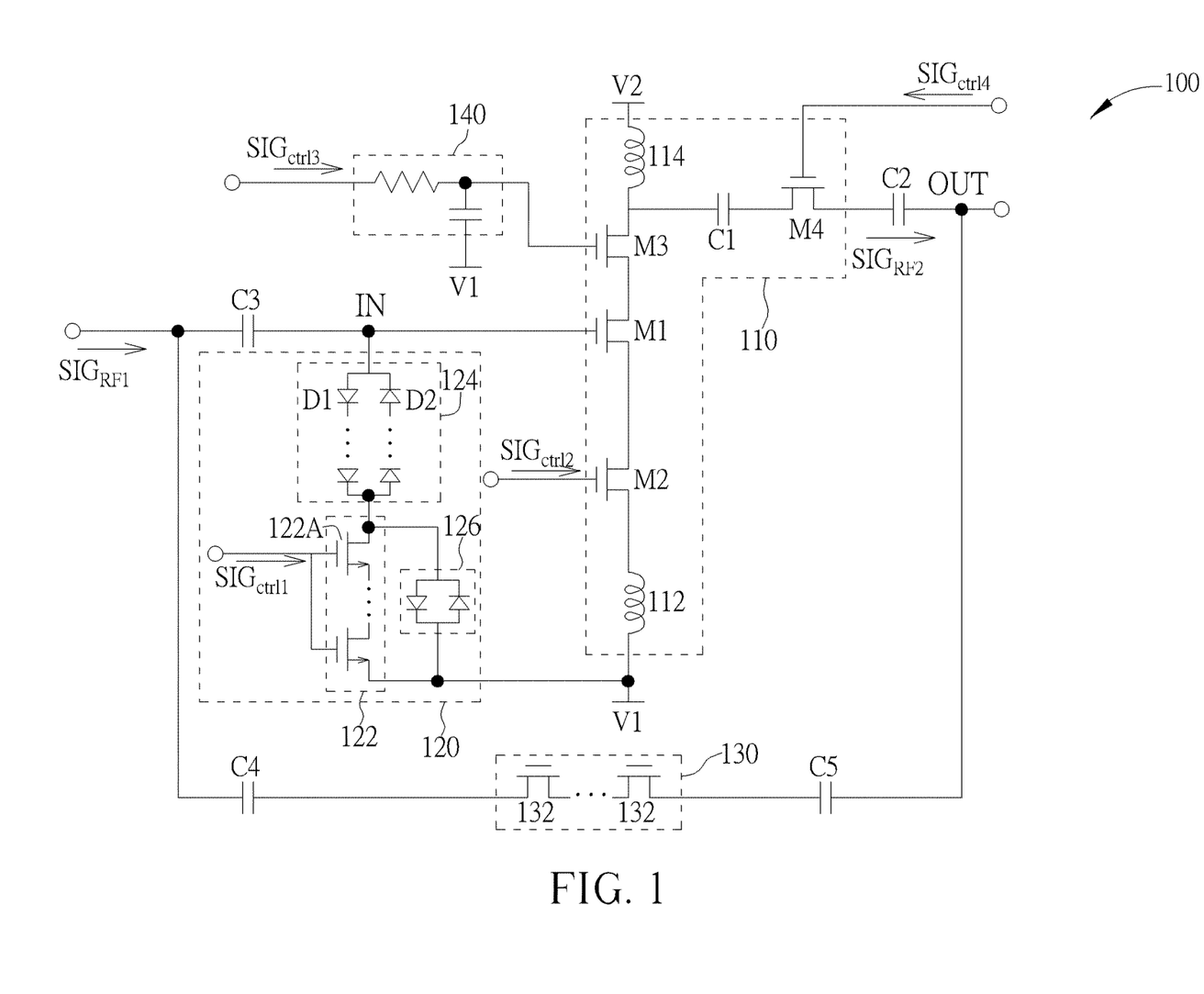
FIG. 1 shows the amplification device according to one embodiment of the present invention.

FIG. 1 shows the amplification device 100 according to one embodiment of the present invention. The amplification device 100 includes an amplification circuit 110 and a protection circuit 120. The amplification circuit 110 can amplify the input signal $SIG_{RF1}$ (such as radio frequency (RF) signals), and the protection circuit 120 can protect the amplification circuit 110 from being damaged by high power input signals.

The amplification circuit 110 has an input terminal IN and an output terminal OUT, the input terminal IN of the amplification circuit 110 can receive the input signal $SIG_{RF1}$, and the output terminal OUT of the amplification circuit 110 can output the amplified input signal $SIG_{RF2}$. In FIG. 1, the amplification circuit 110 can include a transistor M1. The transistor M1 has a first terminal, a second terminal, and a control terminal. The first terminal of the transistor M1 can output the amplified input signal $SIG_{RF2}$, and the control terminal of the transistor M1 can be coupled to the input terminal of the amplification circuit 110.

The protection circuit 120 has a first terminal and a second terminal. The first terminal of the protection circuit 120 can be coupled to the input terminal of the amplification circuit 110, and the second terminal of the protection circuit 120 can receive the first reference voltage V1. The protection circuit 120 can include a switch unit 122 and a voltage clamping unit 124. The switch unit 122 can be turned on or turned off according to a control signal $SIG_{ctrl1}$. The voltage clamping unit 124 can be coupled to the switch unit 122. In some embodiments, when the switch unit 122 is turned on, the voltage clamping unit 124 can clamp the voltage at the first terminal of the protection circuit 120 within a predetermined region. That is, if the input terminal of the amplification circuit 110 receives an input signal with high intensity, that is, with a large amplitude swing, then the switch unit 122 can be turned on, so that the voltage clamping unit 124 can clamp the voltage of the input signal within the predetermined region endurable by the amplification circuit 110, preventing or reducing the damages on the amplification circuit 110.

In addition, in FIG. 1, the amplification device 100 can further include a bypass circuit 130. The bypass circuit 130 can be coupled between the input terminal IN and the output terminal OUT of the amplification circuit 110. When the amplification device 100 enables the bypass mode, the bypass circuit 130 can provide a bypass path between the input terminal IN and the output terminal OUT of the amplification circuit 110. For example, if the intensity of the input signal $SIG_{RF1}$ received by the amplification device 100 is not strong enough and needs to be amplified by the amplification circuit 110, then the amplification device 100 will enable the amplification mode, so that the input signal $SIG_{RF1}$ will be amplified to output the amplified input signal $SIG_{RF2}$ while turning off the bypass circuit 130 to prevent the input signal $SIG_{RF1}$ from passing from the input terminal IN to the output terminal OUT through the bypass circuit 130. However, if the intensity of the input signal $SIG_{RF1}$ received by the amplification device 100 is strong enough and does not need to be amplified by the amplification circuit 110, then the amplification device 100 will enable the bypass mode to turn on the bypass circuit 130, so that the input signal $SIG_{RF1}$ can be transmitted from the input terminal IN to the output terminal OUT through the bypass circuit 130 directly, saving the power consumption of the amplification circuit 110.

In FIG. 1, the bypass circuit 130 can include a plurality of transistors 132, and the plurality of transistors 132 can be connected in series between the input terminal IN and the output terminal OUT of the amplification circuit 110. Consequently, it can be avoided that when the amplification mode is enabled, a single transistor is misconducted due to a large swing of the input signal, thereby causing the bypass mode to be enabled by mistake.

Furthermore, in the bypass mode, if the input signal $SIG_{RF1}$ is inputted to the protection circuit 120 while the impedance is mismatched, then the linearity region of the amplification device 100 may shrink. To address this issue, the amplification device 100 can turn off the switch unit 122 in the bypass mode, and only turn on the switch unit 122 when the amplification circuit 110 is required to amplify the input signal $SIG_{RF1}$, that is when the amplification device 100 enables the amplification mode. Consequently, the amplification device 100 can maintain its linearity performance even in the bypass mode while protecting the amplification circuit 100 with the protection circuit 120 when using the amplification circuit 110 to amplify the input signal $SIG_{RF1}$.

In FIG. 1, the voltage clamping unit 124 has a first terminal and a second terminal. The first terminal of the voltage clamping unit 124 can be coupled to the first terminal of the protection circuit 120. The switch unit 122 has a first terminal, a second terminal, and a control terminal. The first terminal of the switch unit 122 can be coupled to the second terminal of the voltage clamping unit 124, and the second terminal of the switch unit 122 can be coupled to the second terminal of the protection circuit 120 for receiving the first reference voltage V1, for example a common voltage or the ground voltage of the system. Also, the control terminal of the switch unit 122 can receive the control signal $SIG_{ctrl1}$.

In addition, in FIG. 1, the switching unit 122 can include a plurality of transistors 122A coupled in series for reducing the chance of mistakenly turning on the switch unit 122. However, in some embodiments of the present invention, the switch unit 122 can include one single transistor 122A. Also, since the transistor 122A does not need to be operated in a high current application, the size of each transistor 122A can be smaller than the size of the transistor M1 for saving the area of the switch unit 122. In FIG. 1, each of the transistors 122A in the switch unit 122 can be a metal-oxide-semiconductor field effect transistor (MOSFET). However, in some other embodiments, the transistors 122A in the switch unit 122 can be bipolar junction transistors (BJT).

Furthermore, the voltage clamping unit 124 can include at least one diode D1 and at least one diode D2. The diodes D1 can be coupled between the first terminal of the voltage clamping unit 124 and the second terminal of the voltage clamping unit 124 in the same first voltage biasing manner (for example but not limited to, forward biasing). Also, the diodes D2 can be coupled between the first terminal of the voltage clamping unit 124 and the second terminal of the voltage clamping unit 124 in the same second voltage biasing manner (for example but not limited to, reverse biasing). That is, the diodes D1 and the diodes D2 can be coupled in parallel in different voltage biasing manners. Consequently, when the input signal has an excessive positive swing, the diodes D1 biased in the first voltage biasing manner will be turned on, diverting the input signal and reducing the possibility of the input signal damaging the amplification circuit 110. Conversely, when the input signal has an excessive negative swing, the diodes D2 biased in the second voltage biasing manner will be turned on, diverting the input signal and reducing the possibility of the input signal damaging the amplification circuit 110.

In some embodiments, according to the characteristics of different types of input signals, the voltage clamping unit 124 can include only one of the diodes D1 biased in the first voltage biasing manner or the diodes D2 biased in the second voltage biasing manner. Moreover, in some embodiments, the number of the diodes D1 and the number of the diodes D2 can be the same or can be different.

In FIG. 1, to protect the transistors in the bypass circuit 130 during the bypass mode, the protection circuit 120 can further include a voltage clamping unit 126 coupled in parallel with the switch unit 122. Consequently, when the switch unit 122 is turned off in the bypass mode, the voltage clamping units 124 and 126 can together clamp the voltage of the input signal, so that the bypass circuit 130 can be protected while not distorting the input signal having greater amplitudes. In addition, in some other embodiments, the protection circuit 120 can replace the voltage clamping unit 126 with an impedance unit. The impedance unit can be, for example but not limited to, a resistor, and can be coupled in parallel with the switch unit 122 for protecting the bypass circuit 130. Furthermore, in some other embodiments, the protection circuit 120 may omit the voltage clamping unit 126 or the impedance unit according to actual operating conditions.

In FIG. 1, in addition to the transistor M1, the amplification circuit 110 can further include transistors M2, M3, and M4, passive elements 112 and 114, a capacitor C1. Also, the amplification device 100 can further include a resistor-capacitor filter (RC filter) 140, and capacitors C2, C3, C4, and C5. The transistor M2 has a first terminal, a second terminal, and a control terminal. The first terminal of the transistor M2 can be coupled to the second terminal of the transistor M1, and the control terminal of the transistor M2 can receive the control signal $SIG_{ctrl2}$. The passive element 112 has a first terminal and a second terminal. The first terminal of the passive element 112 can be coupled to the second terminal of the transistor M2, and the second terminal of the passive element 112 can receive the first reference voltage V1. The transistor M3 has a first terminal, a second terminal, and a control terminal. The second terminal of the transistor M3 can be coupled to the first terminal of the transistor M1, and the control terminal of the transistor M3 can receive the control signal $SIG_{ctrl3}$. In some embodiments, the transistors M2 and M3 can reduce the cross voltage endured by the transistor M1, thereby protecting the transistor M1 and increasing the amplification gain.

The passive element 114 has a first terminal and a second terminal. The first terminal of the passive element 114 can receive the second reference voltage V2, and the second terminal of the passive element 114 can be coupled to the first terminal of the transistor M3. In some embodiments, the first reference voltage V1 can be, for example but not limited to, the reference voltage of the system, and the second reference voltage V2 can be, for example but not limited to, the operation voltage of the system. Also, the second reference voltage V2 can be greater than the first reference voltage V1. In addition, in some embodiments, the passive elements 112 and 114 can be, for example but not limited to, inductors for choking the high frequency noises in the bias voltage.

The capacitor C1 has a first terminal and a second terminal. The first terminal of the capacitor C1 can be coupled to the second terminal of the passive element 114, and can be used as the matching impedance of the amplification circuit 110. The transistor M4 has a first terminal, a second terminal, and a control terminal. The first terminal of the transistor M4 can be coupled to the second terminal of the capacitor C1, the second terminal of the transistor M4 can be coupled to the output terminal OUT of the amplification circuit 110, and the control terminal of the transistor M4 can receive the control signal $SIG_{ctrl4}$. The control signal $SIG_{ctrl4}$ can turn on the transistor M4 when the amplification device 100 enables the amplification mode, and the control signal $SIG_{ctrl4}$ can turn off the transistor M4 when the amplification device 100 enables the bypass mode.

In some embodiments, the transistor M4 may be coupled to the output terminal OUT through the capacitor C2, the first terminal of the capacitor C2 can be coupled to the second terminal of the transistor M4, and the second terminal of the capacitor C2 can be coupled to the output terminal OUT for blocking the direct current signal. The capacitor C3 can be coupled to the input terminal IN, and can provide the matching impedance for the input terminal IN to receive the input signal $SIG_{RF1}$ while blocking the direct current signal. The capacitors C4 and C5 can be coupled to the two terminals of the bypass circuit 130. The capacitors C4 and C5 can provide the matching impedance for the bypass circuit 130 to receive the input signal $SIG_{RF1}$ while blocking the direct current signal. In FIG. 1, the first terminal of the capacitor C5 can be coupled to the bypass circuit 130, and the second terminal of the capacitor C5 can be coupled to the second terminal of the capacitor C2. However, in some other embodiments, the second terminal of the capacitor C5 may be coupled to the first terminal of the capacitor C2.

The resistor-capacitor filter 140 can be coupled to the control terminal of the transistor M3, and can filter the noises in the control signal $SIG_{ctrl3}$, so that the transistor M3 can be operated more stably.

Since the protection circuit 120 of the amplification device 100 can turn on the switch unit 122 and use the voltage clamping unit 124 for rectification when the amplification circuit 110 is enabled to amplify the input signal $SIG_{RF1}$, the transistors in the amplification circuit 110 can be protected effectively. In addition, the protection circuit 120 can turn off the switch unit 122 in the bypass mode so as to reduce the input signal $SIG_{RF1}$ flowing into the protection circuit 120 having a mismatched impedance, allowing the amplification device 100 to maintain a better linearity performance. In FIG. 1, the voltage clamping unit 124 of the protection circuit 120 can be coupled to the first terminal of the protection circuit 120 while the switch unit 122 can be coupled to the second terminal of the protection circuit 120. However, the present invention is not limited by the structure shown in FIG. 1.

Figure 2:
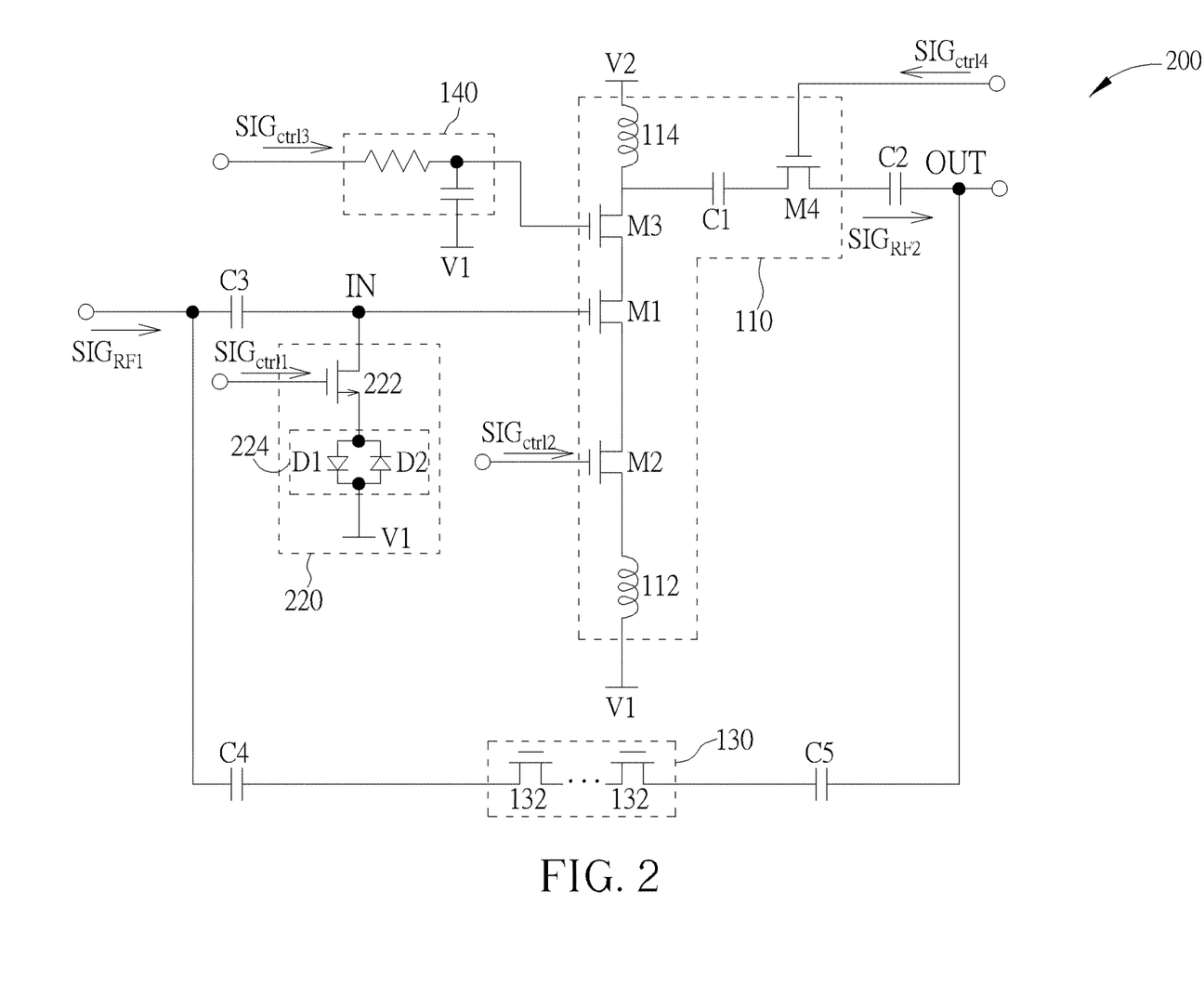
FIG. 2 shows the amplification device according to another embodiment of the present invention.

FIG. 2 shows an amplification device 200 according to another embodiment of the present invention. The amplification devices 100 and 200 have similar structures and can be operated with similar principles. However, the protection circuit 220 of the amplification device 200 can include the switch unit 222 and the voltage clamping unit 224. The first terminal of the switch unit 222 is coupled to the first terminal of the protection circuit 220, and the control terminal of the switch unit 222 can receive the control signal $SIG_{ctrl1}$. The first terminal of the voltage clamping unit 224 can be coupled to the second terminal of the switch unit 222, the second terminal of the voltage clamping unit 224 can be coupled to the second terminal of the protection circuit 220, and the second terminal of the protection circuit 220 can receive the first system voltage V1. In some embodiments, the control signal $SIG_{ctrl1}$ can be lower than the first system voltage V1 when turning off the switch unit 222. In this case, the switch unit 222 can be protected from being turned on unexpectedly.

Figure 3:
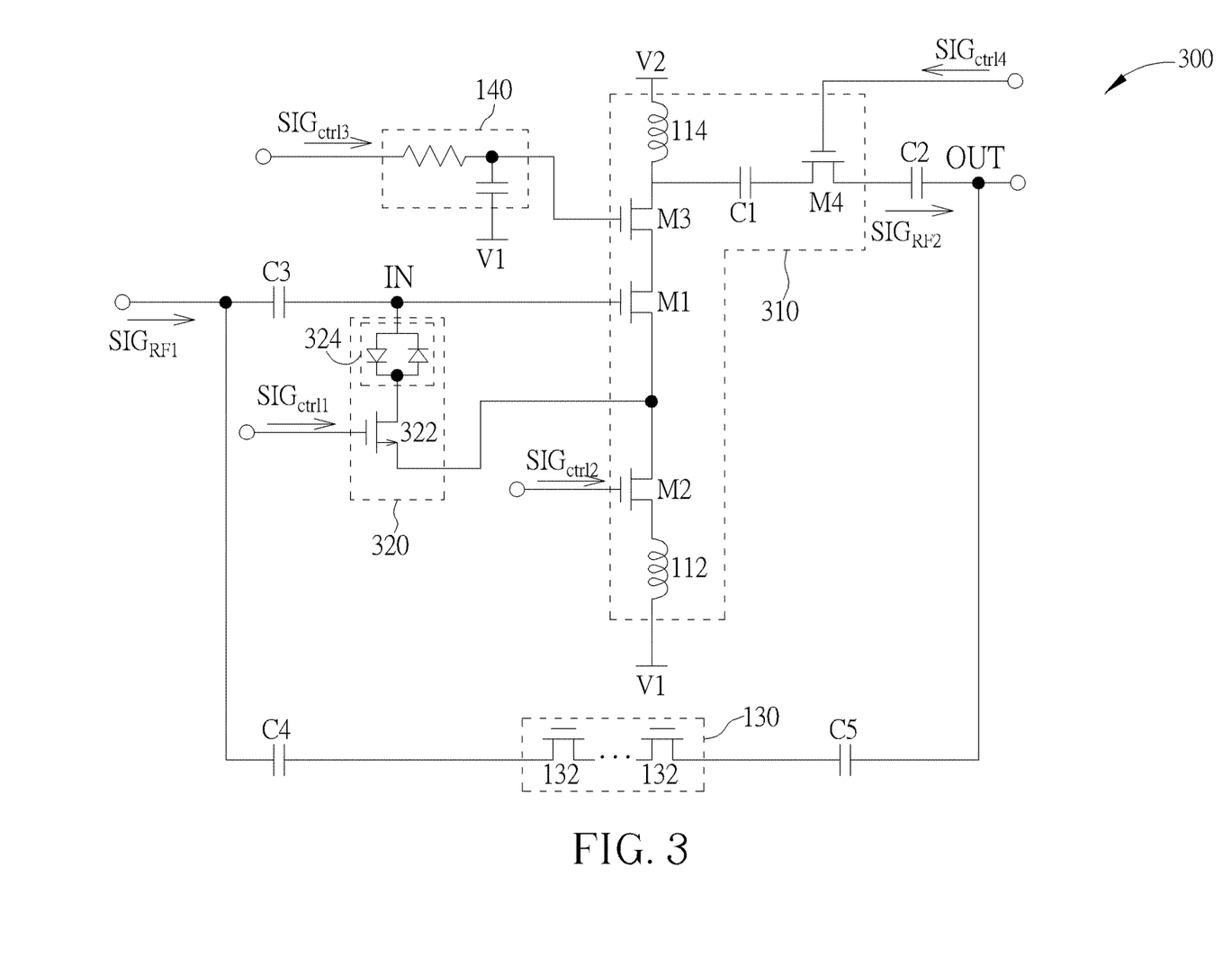
FIG. 3 shows the amplification device according to another embodiment of the present invention.

In addition, in FIGS. 1 and 2, the second terminal of the protection circuit 120, 220 can receive the first system voltage V1, however, the present invention is not limited thereto. FIG. 3 shows an amplification device 300 according to another embodiment of the present invention. The amplification devices 100 and 300 have similar structures and can be operated with similar principles. However, in the protection circuit 320 of the amplification device 300, the voltage clamping unit 324 and the switch unit 322 can be coupled between the first terminal and the second terminal of the protection circuit 320, and the second terminal of the switch unit 322 can be coupled to the second terminal of the protection circuit 320 and the first terminal of the transistor M2. That is, the switch unit 332 of the protection circuit 320 can be stacked with the transistor M2 of the amplification circuit 310 so as to reduce the possibility of the switch unit 322 in the protection circuit 320 being turned on unexpectedly. Consequently, the number of transistors used in the switch unit 322 can be reduced, and the area of the amplification device 300 can be reduced.

Figure 4:
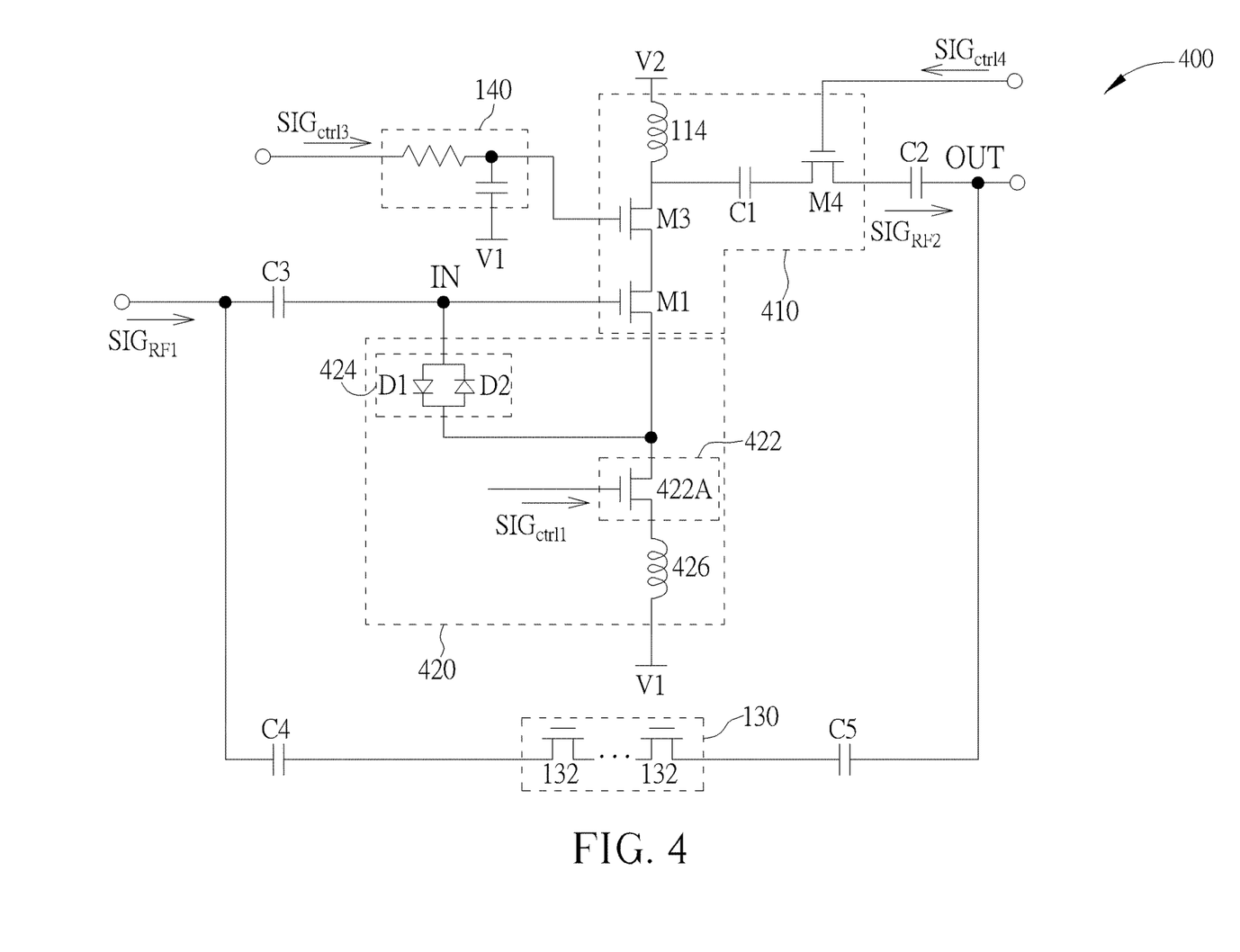
FIG. 4 shows the amplification device according to another embodiment of the present invention.

FIG. 4 shows an amplification device 400 according to another embodiment of the present invention. The amplification devices 300 and 400 have similar structures and can be operated with similar principles. However, the function of the transistor M2 in the amplification circuit 310 and the function of the switch unit 322 in the protection circuit 320 of the amplification device 300 can be implemented by one transistor, for example, in the amplification device 400, the transistor 422A of the switch unit 422 can also be used as the transistor M2 in the amplification device 300. In this case, the first terminal of the transistor 422A can be coupled to the second terminal of the transistor M1, and the second terminal of the transistor 422A can be coupled to the first terminal of the passive resistor 426. Also, the second terminal of the voltage clamping unit 424 can be couple to the second terminal of the transistor M1. That is, the transistor 422A can be used to control the protection circuit 420, and also to control the amplification circuit 410. In this case, the size of the transistor 422A of the switching unit 422 can be greater than the size of the transistor M1 so that the transistor 422A will not limit the current rating of the amplification circuit 410. Also, in some other embodiments, the function of the transistor 422A can be implemented by the transistor M2 in the amplification device 300, so the transistor 422A may be omitted and the transistor M2 is retained in the amplification circuit.

That is, in FIG. 4, the amplification circuit 410 can share the transistor 422A of the switch unit 422 with the protection circuit 420. Therefore, while the amplification device 300 requires two transistors, namely the transistor M2 and the transistor 322A, the amplification device 400 can use only one transistor, that is, the transistor 422A, to achieve the same function.

Furthermore, in FIG. 4, the protection circuit 420 can further include a passive element 426. The passive element 426 has a first terminal and a second terminal. The first terminal of the passive element 426 can be coupled to the second terminal of the switch unit 422, and the second terminal of the passive element 426 can be coupled to the second terminal of the protection circuit 420 for receiving the first reference voltage V1. Consequently, since the amplification circuit 410 and the protection circuit 420 can share the transistor in the switch unit 422, the number of transistors in the amplification device 400 can be reduced, and thereby reducing the area of the amplification device 400.

In FIGS. 1 to 4, the first terminals of the protection circuits 120, 220, 320 and 420 can be coupled to the input terminals of the corresponding amplification circuits 110, 310, and 410 to protect the amplification circuits 110, 310, and 410. However, in some other embodiments, the amplification circuits 110, 310, and 410 can be coupled to other amplification devices to form a multi-stage amplification device and amplify the input signal $SIG_{RF1}$ to a sufficient level of intensity. In this case, the first terminals of the protection circuits 120, 220, 320, and 420 may also be coupled to the output terminals of the amplification circuits 110, 310, and 410 for protecting the amplification device of a following stage.

In summary, the amplification device provided by the embodiments of the present invention can reduce the possibility of the amplifier circuit being damaged by high-intensity input signals with the protection circuit. In addition, since the protection circuit can include a switch unit and a voltage clamping unit, the amplification device can turn off the switch unit to maintain or improve the linearity performance when enabling the bypass mode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplification device comprising:
an amplification circuit configured to amplify an input signal, and having an input terminal configured to receive the input signal, and an output terminal configured to output an amplified input signal, the amplification circuit comprising a first transistor having a first terminal configured to output the amplified input signal, a second terminal, and a control terminal coupled to the input terminal of the amplification circuit; and
a protection circuit having a first terminal coupled to the input terminal of the amplification circuit, and a second terminal, the protection circuit comprising:
a switch unit configured to be turned on or turned off according to a first control signal; and
a first voltage clamping unit coupled to the switch unit, and configured to clamp a voltage at the first terminal of the protection circuit within a predetermined region when the switch unit is turned on;
wherein:
when the amplification device amplifies the input signal with the amplification circuit, the switch unit is turned on; and
when the amplification device enables a bypass mode, the switch unit is turned off.

2. The amplification device of claim 1 further comprising a bypass circuit coupled to the input terminal of the amplification circuit and the output terminal of the amplification circuit, and configured to provide a bypass path between the input terminal of the amplification circuit and the output terminal of the amplification circuit when the amplification device enables the bypass mode.

3. The amplification device of claim 1, wherein:
the switch unit has a first terminal coupled to the first terminal of the protection circuit, a second terminal, and a control terminal configured to receive the first control signal; and
the first voltage clamping unit has a first terminal coupled to the second terminal of the switch unit, and a second terminal coupled to the second terminal of the protection circuit.

4. The amplification device of claim 1, wherein:
the first voltage clamping unit has a first terminal coupled to the first terminal of the protection circuit, and a second terminal; and
the switch unit has a first terminal coupled to the second terminal of the first voltage clamping unit, a second terminal, and a control terminal configured to receive the first control signal.

5. The amplification device of claim 4, wherein:
the second terminal of the first voltage clamping unit is further coupled to the second terminal of the first transistor.

6. The amplification device of claim 5, wherein the protection circuit further comprises a passive element having a first terminal coupled to the second terminal of the switch unit, and a second terminal coupled to the second terminal of the protection circuit and configured to receive a first reference voltage.

7. The amplification device of claim 5, wherein:
the switch unit comprises at least one transistor, and a size of the at least one transistor of the switch unit is greater than a size of the first transistor.

8. The amplification device of claim 4, wherein the amplification circuit further comprises:
a second transistor having a first terminal coupled to the second terminal of the first transistor, a second terminal, and a control terminal configured to receive a second control signal; and
a passive element having a first terminal coupled to the second terminal of the second transistor, and a second terminal configured to receive a first reference voltage.

9. The amplification device of claim 8, wherein the second terminal of the switch unit is coupled to the second terminal of the protection circuit and the first terminal of the second transistor.

10. The amplification device of claim 8, wherein the second terminal of the switch unit is coupled to the second terminal of the protection circuit and configured to receive the first reference voltage.

11. The amplification device of claim 8, wherein:
the switch unit comprises at least one transistor, and a size of the at least one transistor of the switch unit is smaller than a size of the first transistor.

12. The amplification device of claim 11, wherein each transistor of the switch unit is a metal-oxide semiconductor field effect transistor (MOSFET) or a bipolar junction transistor (BJT).

13. The amplification device of claim 2, wherein the amplification circuit further comprises:
- a third transistor having a first terminal, a second terminal coupled to the first terminal of the first transistor, and a control terminal configured to receive a third control signal;
- a passive element having a first terminal configured to receive a second reference voltage, a second terminal coupled to the first terminal of the third transistor;
- a capacitor having a first terminal coupled to the second terminal of the passive element, and a second terminal; and
- a fourth transistor having a first terminal coupled to the second terminal of the capacitor, a second terminal coupled to the output terminal of the amplification circuit, and a control terminal configured to receive a fourth control signal;

wherein when the amplification device enables the bypass mode, the fourth transistor is turned off.

14. The amplification device of claim 1, wherein the protection circuit further comprises a second voltage clamping unit coupled in parallel with the switch unit.

15. The amplification device of claim 1, wherein the protection circuit further comprises an impedance unit coupled in parallel with the switch unit.

16. The amplification device of claim 1, wherein the first voltage clamping unit comprises at least one first diode, and the at least one first diode is coupled between the first terminal of the first voltage clamping unit and the second terminal of the first voltage clamping unit with a same first voltage biasing manner.

17. The amplification device of claim 16, wherein the first voltage clamping unit further comprises at least one second diode, and the at least one second diode is coupled between the first terminal of the first voltage clamping unit and the second terminal of the first voltage clamping unit with a same second voltage biasing manner different from the first voltage biasing manner.

* * * * *